（12) United States Patent
Chen et al.

(10) Patent No.: US 10,593,781 B2
(45) Date of Patent: Mar. 17, 2020

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: De Yan Chen, Shanghai (CN); Yan Chun Ma, Shanghai (CN); Dae-Sub Jung, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/491,270

(22) Filed: Apr. 19, 2017

(65) Prior Publication Data

US 2017/0358661 A1   Dec. 14, 2017

(30) Foreign Application Priority Data

Jun. 12, 2016 (CN) .......................... 2016 1 0407520

(51) Int. Cl.
*H01L 29/66* (2006.01)
*H01L 29/78* (2006.01)
(Continued)

(52) U.S. Cl.
CPC ...... *H01L 29/66681* (2013.01); *H01L 21/266* (2013.01); *H01L 21/26586* (2013.01);
(Continued)

(58) Field of Classification Search
None
See application file for complete search history.

(56) References Cited

U.S. PATENT DOCUMENTS 8,212,318 B2*   7/2012 Knaipp .............. H01L 29/7816
                                                        257/341
2008/0191276 A1*   8/2008 Chen ................. H01L 29/66689
                                                        257/343
(Continued)

OTHER PUBLICATIONS

The European Patent Office (EPO) The Extended European Search Report for 17174797.5 dated Nov. 6, 2017 8 Pages.

*Primary Examiner* — David E Graybill
(74) *Attorney, Agent, or Firm* — Anova Law Group, PLLC

(57) ABSTRACT

The present disclosure provides a method for forming a semiconductor device, including: providing a substrate; forming a gate material layer over the substrate; performing a first etching process on the gate material layer to remove a first portion of the gate material layer and expose a first portion of the substrate; performing a first ion implantation process on the first portion of the substrate to form a body region in the substrate, the body region being doped with first dopant ions and extending to under a remaining portion of the gate material layer; and forming a gate electrode by performing a second etching process on the remaining portion of the gate material layer to remove a second portion of the gate material layer, the second portion of the gate material layer being located on a side away from the body region.

20 Claims, 4 Drawing Sheets

(51) Int. Cl.
- *H01L 29/10* (2006.01)
- *H01L 21/265* (2006.01)
- *H01L 21/266* (2006.01)
- *H01L 21/3213* (2006.01)

(52) U.S. Cl.
CPC .. *H01L 21/32133* (2013.01); *H01L 21/32139* (2013.01); *H01L 29/1045* (2013.01); *H01L 29/66659* (2013.01); *H01L 29/7835* (2013.01)

(56) References Cited

U.S. PATENT DOCUMENTS

| | | |
|---|---|---|
| 2009/0273029 A1* | 11/2009 | Tien .................... H01L 29/4236 257/336 |
| 2010/0044790 A1* | 2/2010 | Kato .................... H01L 29/0847 257/339 |
| 2010/0148254 A1* | 6/2010 | Park ................ H01L 21/823462 257/337 |
| 2010/0213543 A1 | 8/2010 | Zhang et al. |
| 2011/0244644 A1 | 10/2011 | Zuniga |
| 2015/0162439 A1* | 6/2015 | Hoentschel ......... H01L 29/7816 257/77 |
| 2016/0087081 A1 | 3/2016 | You et al. |
| 2017/0271482 A1* | 9/2017 | Jung .................... H01L 21/0274 |
| 2017/0358661 A1* | 12/2017 | Chen ................. H01L 21/26586 |

* cited by examiner

SEMICONDUCTOR DEVICE AND FABRICATION METHOD THEREOF

CROSS-REFERENCES TO RELATED APPLICATIONS

This application claims the priority of Chinese patent application No. 201610407520.3, filed on Jun. 12, 2016, the entirety of which is incorporated herein by reference.

FIELD OF THE INVENTION

The present invention generally relates to the field of semiconductor manufacturing technology and, more particularly, relates to a semiconductor device and a fabrication method for forming the semiconductor device.

BACKGROUND

A lateral diffusion MOS transistor (LDMOS) transistor is a semiconductor device with a lateral current path formed on the surface of semiconductor substrate by planar diffusion. Compared with other MOS transistors, a lightly doped region between the source region and the drain region in the LDMOS transistor is formed. The lightly doped region is referred to as a drift region. When a high voltage is applied between the source region and the drain region of the LDMOS transistor, the drift region is able to withstand a high voltage. Therefore, the LDMOS transistor may have a higher breakdown voltage.

An LDMOS transistor is compatible with CMOS process, so LDMOS transistors can be widely used in the power devices. The on-resistance ($R_{dson}$) and the breakdown voltage (BV) are two important indicators in determining the device performance.

An LDMOS transistor includes a source region and a drain region in the semiconductor substrate, and a channel region between the source region and the drain region. A gate electrode is located over the channel region. In addition, different from a field effect transistor, the distance between the drain region and the gate electrode in the LDMOS transistor is greater than the distance between the source region and the gate electrode. The drain region is located in a doped well used to separate the channel region and the drain region.

In order to improve the performance of the LDMOS transistor, reduced surface electric field (RESURF) technique and thin epitaxy (EPI) or N-well region are often used in the LDMOS transistor, to increase the breakthrough voltage and decrease the on-resistance.

However, the breakdown voltage of a conventional LDMOS transistor needs to be improved. The disclosed semiconductor device and fabrication method are directed to solve one or more problems in the art.

BRIEF SUMMARY OF THE DISCLOSURE

One aspect of the present disclosure provides a method for forming a semiconductor device, including: providing a substrate; forming a gate material layer over the substrate; performing a first etching process on the gate material layer to remove a first portion of the gate material layer and expose a first portion of the substrate; performing a first ion implantation process on the first portion of the substrate to form a body region in the substrate, the body region being doped with first dopant ions and extending to under a remaining portion of the gate material layer; and forming a gate electrode by performing a second etching process on the remaining portion of the gate material layer to remove a second portion of the gate material layer, the second portion of the gate material layer being located on a side away from the body region.

Another aspect of the present disclosure provides a method for forming a lateral diffusion MOS (LDMOS) transistor, including: providing a substrate having a drift region and an insulation structure, spaced apart in the substrate by a first spacing; forming a gate material layer over the substrate; forming a gate material layer over the substrate; and performing a first etching process on the gate material layer to remove a first portion of the gate material layer and expose a first portion of the substrate. The method further includes performing a first ion implantation process on the first portion of the substrate to form a body region in the substrate, the body region being doped with first dopant ions and extending to under a remaining portion of the gate material layer, and performing a second etching process on the remaining portion of the gate material layer to remove a second portion of the gate material layer to form a gate electrode, the second portion of the gate material layer being located on a side away from the body region, the gate electrode covering a portion of the body region, a portion of the drift region, and a portion of the substrate between the drift region and the body region.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
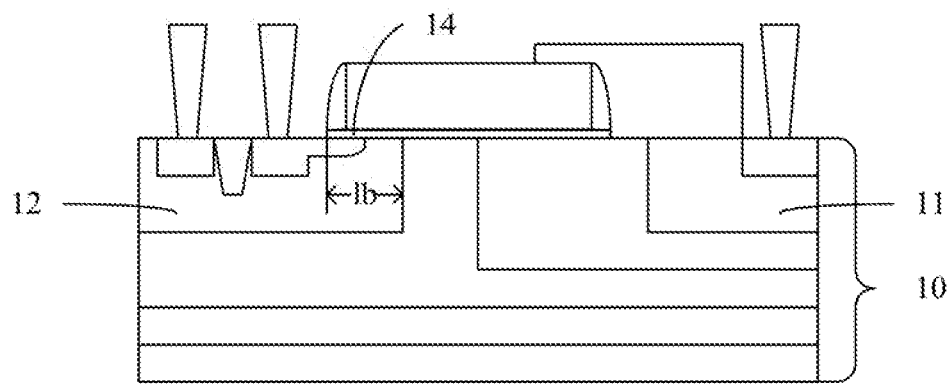
FIG. 1 illustrates an LDMOS transistor.

FIG. 1 illustrates a cross-sectional view of an LDMOS transistor. As shown in FIG. 1, the LDMOS transistor includes a substrate 10. The substrate 10 includes an N-type drift region 11 and a P-type body region 12, separated from each other by a certain distance. The substrate 10 also includes a gate structure 14 over the substrate 10. The gate structure 14 is over a portion of the P-type body region 12, a portion of the N-type drift region 11, and the portion of the substrate 10 between the N-type drift region 11 and P-type body region 12.

When forming the LDMOS transistor shown in FIG. 1, the gate structure 14 is formed by an etching process after the N-type drift region 11 and the P-type body region 12 are formed. To ensure the gate structure 14 covers a portion of the P-type body region 12, and further ensure the controlling ability of the gate structure 14 over the P-type body region 12, during the formation of the gate structure 14, the overlapping distance 1b between the gate structure 14 and the P-type body region 12 is limited by design rules. For example, the overlapping distance 1b cannot be smaller than 0.1 μm. The restriction of the overlapping distance 1b limits the distance between the source region and the drain region, of the LDMOS transistor. As a result, the increase of the breakdown voltage of the formed LDMOS transistor can be limited.

An LDMOS transistor and a method for forming an LDMOS transistor are provided. According to the method, a substrate is first formed, and a gate material layer may be formed over the substrate. A first etching process may be performed on the gate material layer to remove a portion of the gate material layer and expose a portion of the substrate. The exposed portion of the substrate may undergo a first ion implantation process to form a body region in the substrate. The body region may be doped with first dopant ions. The body region may extend to be under the remaining portion of the gate material layer. Further, the remaining portion of the gate material layer may undergo a second etching process to remove a portion of the gate material layer away from the body region. The gate electrode may be formed.

In the present disclosure, a first etching process may be used to remove a portion of the gate material layer to expose a portion of the substrate. Further, a first ion implantation process may be performed on the exposed portion of the substrate to form a body region. Further, a second etching process may be performed to remove another portion of the gate material layer to form the gate electrode. According to the present disclosure, two etching processes may be used to form the gate electrode, the first ion implantation process may be performed between the two etching processes to form the body region. The first ion implantation process may be performed directly on the exposed portion of the substrate. The diffusion of dopant ions may facilitate the body region to extend to be under the gate electrode. Accordingly, the gate electrode may cover and control the body region, and the dimension of the overlapping area between the body region and the gate electrode can be further decreased. The breakdown voltage of the formed transistor can be further increased and the on-resistance of the formed transistor can be further decreased.

Figure 7:
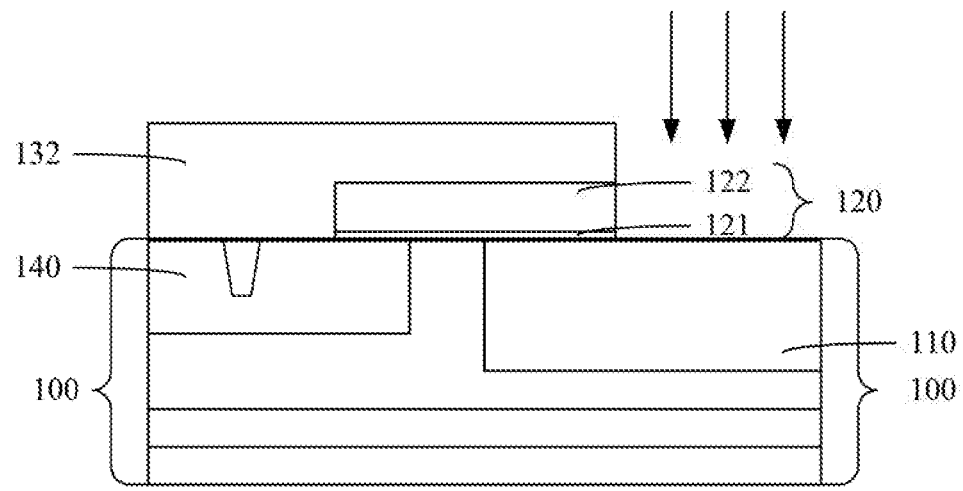
Figure 8:
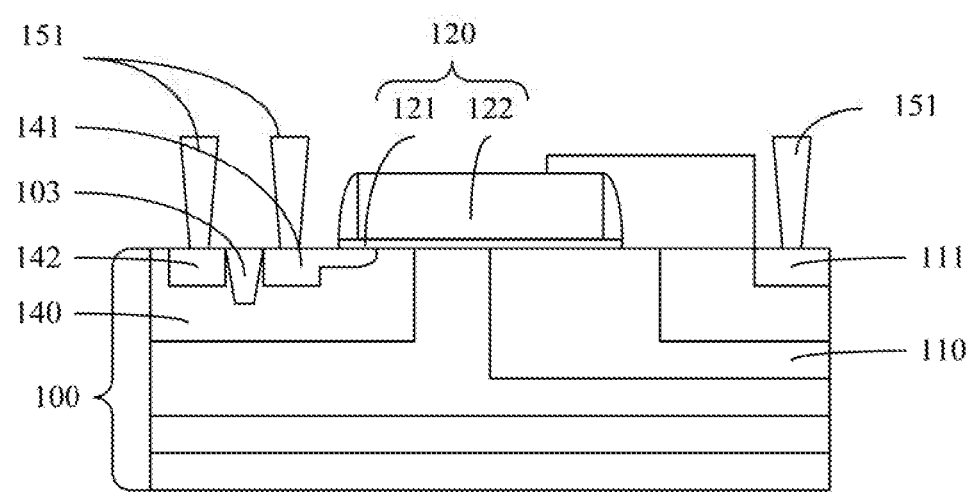
Figure 9:
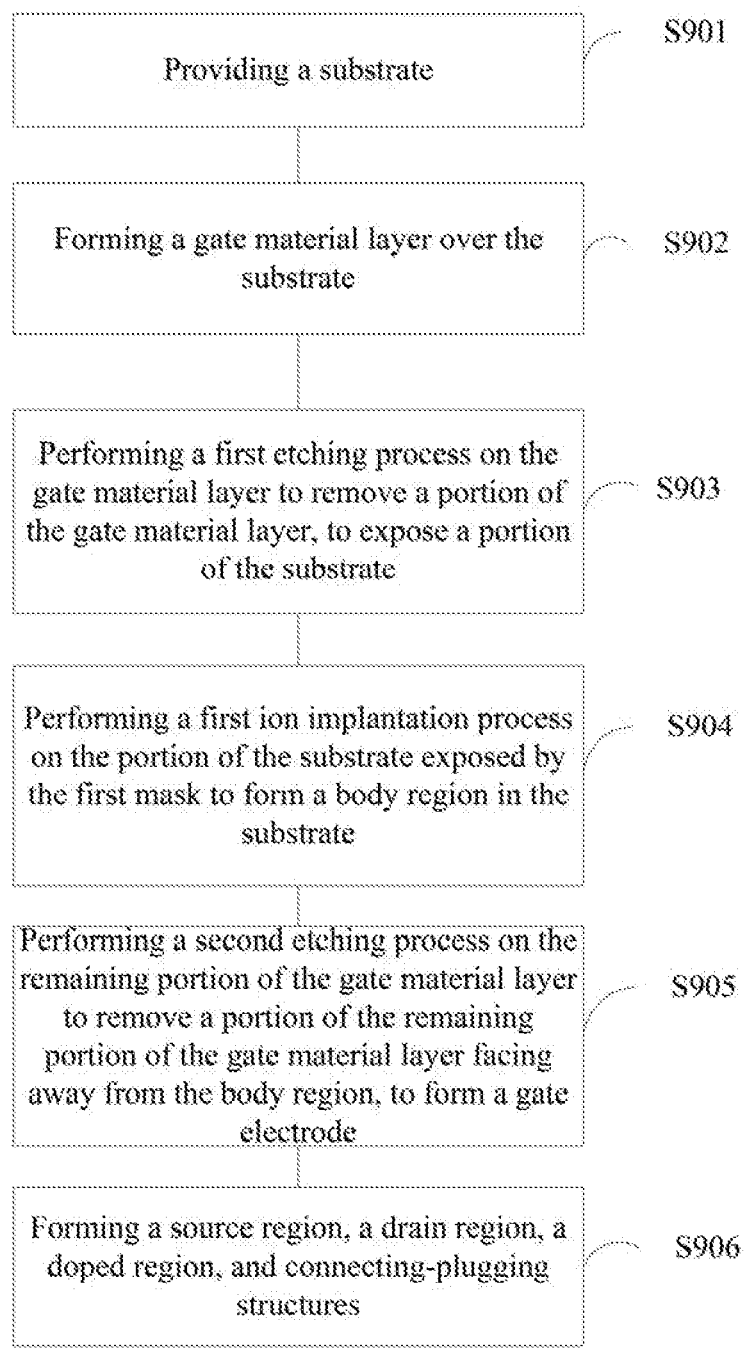
FIG. 9 illustrates an exemplary fabrication process to form an LDMOS transistor consistent with various disclosed embodiments.

FIG. 9 illustrates an exemplary fabrication process for forming an LDMOS transistor, and FIGS. 2-8 illustrate an exemplary semiconductor device at various stages of an exemplary fabrication process. The LDMOS transistor may be illustrated as an example only, the fabrication method may also be used to form other suitable types of transistors.

Figure 2:
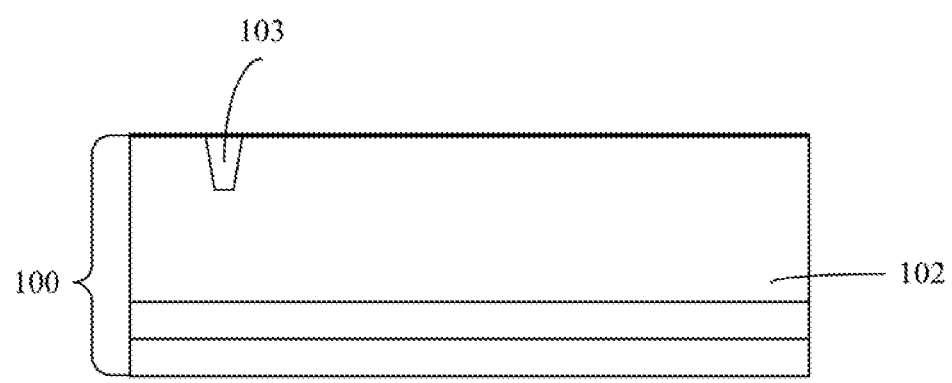
FIGS. 2-8 each illustrates a cross-sectional view of an exemplary semiconductor device at a certain stage of an exemplary fabrication process consistent with various disclosed embodiments.
Figure 3:
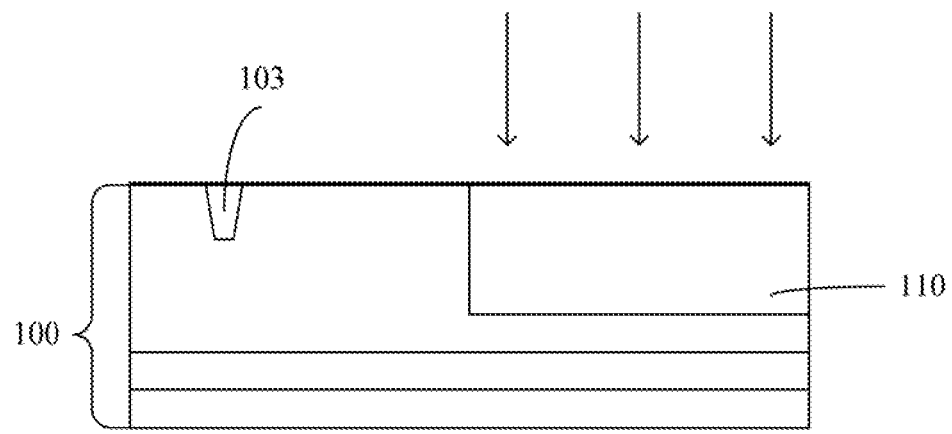

At the beginning of the process, as shown in FIG. 9, a substrate is provided (S901). FIGS. 2 and 3 illustrate corresponding structures.

As shown in FIG. 2 and FIG. 3, a substrate 100 may be formed first.

In one embodiment, the transistor may be an LDMOS transistor. Accordingly, the process to form the substrate 100 may include providing a substrate, as shown in FIG. 2. The substrate may be a platform for the subsequent fabrication process. In one embodiment, the substrate may include an epitaxial layer or may be an epitaxial layer on silicon structure. The substrate may further be made of one or more of single crystalline silicon, poly-crystalline silicon, and amorphous silicon. The substrate may also be made of one or more of silicon, germanium, gallium arsenide, and silicon germanium compound. The substrate may also be made of other appropriate semiconductor materials. More specifically, the substrate may be a P-type substrate.

In order to increase the breakdown voltage of the formed transistor and to reduce the on-resistance of the transistor, after providing the substrate, the process to form the transistor may also include performing an ion implantation on the substrate to forming a well region 102 in the substrate.

The well region 102 may be doped with first dopant ions, the first dopant ions may be N-type ions or P-type ions, depending on the type of the LDMOS transistors. In one embodiment, the LDMOS transistor may be an N-type transistor, and the first dopant ions may be P-type ions, which may include one or more of boron ions, indium ions, and gallium ions. Specifically, in one embodiment, the well region 102 may be a high voltage P-well (HVPW).

In addition, in one embodiment, the substrate may be a P-type substrate. Before forming well region 102, the process to form the semiconductor device may further include forming a deep N-well (DNW) in the substrate.

As shown in FIG. 2, an insulation structure 103 may be formed in the substrate.

The insulation structure 103 may be located in the well region 102, functioning as an electrical insulator between the subsequently-formed doped regions. The insulation structure 103 may be made of one or more of silicon oxide, silicon nitride, and silicon oxynitride.

The process to form the insulation structure 103 may include forming a first patterning layer over the substrate, the first patterning layer being used to define the dimensions and location of the insulation structure 103. Further, the first patterning layer may be used as a mask to etch the substrate to form a trench in the substrate. An insulating material may fill up the trench to form the insulation structure 103.

Referring to FIG. 3, a drift region 110, doped with second dopant ions, may be formed in the substrate on one side of the insulation structure 103. The drift region 110 and the insulation structure 103 may be separated by a first spacing between adjacent sidewalls of drift region 110 and the insulation structure 103.

Because the subsequent fabrication steps include ion implantations, in one embodiment, after providing the substrate and before forming the drift region 110, the method to form the semiconductor device may further include forming a sacrificial oxide layer (SAC ox) on the surface of the substrate, to protect the substrate during the ion implantations.

The drift region 110 may be used to separate the drain region and the channel region of the LDMOS transistor, to extend the current channel of the transistor, and to improve the breakdown voltage of the LDMOS transistor. The drift region 110 may be doped with second dopant ions. The second dopant ions and the first dopant ions may have opposite conductivity types.

Specifically, in one embodiment, the LDMOS transistor may be an N-type transistor. The first dopant ions may be P-type ions, and the second dopant ions may be N-type ions. The second dopant ions may be one or more of phosphorus ions, arsenic ions, and antimony ions. That is, the drift region may be an N-type drift region.

In other embodiment of the present disclosure, when the LDMOS transistor is a P-type transistor, the second dopant ions may be P-type ions.

Because a body region is to be formed in the substrate adjacent to the insulation structure 103, the drift region 110 may be located at one side of the insulation structure 103, and may be separated from the insulation structure 103 by the first spacing.

The process to form the drift region 110 may include forming a second patterning layer over the surface of the substrate, and the second patterning layer may include an opening at the bottom that exposes the surface of the substrate. The dimensions and the location of the opening may correspond to the dimensions and location of the drift region 110. The second patterning layer may be used as a mask to perform an ion implantation along the opening. Second dopant ions may be doped into the substrate through the ion implantation, and a drift region 110 may be formed in the substrate.

Figure 4:
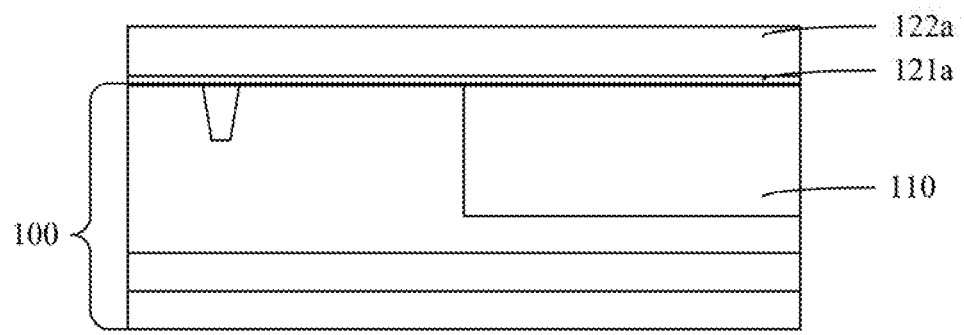

Referring to FIG. 9, after providing the substrate, a gate material layer is formed over the substrate (S902). FIG. 4 illustrates a corresponding structure.

As shown in FIG. 4, a gate material layer 122a may be formed over the substrate 100.

After forming the drift region 110, and before forming the gate material layer 122a, the process to form the semiconductor device may further include forming a well region (not shown in the figures) in the substrate.

The gate material layer 122a may be used to form the gate electrode. In one embodiment, the gate material layer 122a may be formed on the surface of the substrate through one or more of chemical vapor deposition, physical vapor deposition, atomic layer deposition, and other suitable deposition processes. Specifically, in one embodiment, the gate electrode may a poly-Si gate electrode and the gate material layer 122a may be made of poly-crystalline silicon.

After providing the substrate 100, and before forming the gate material layer 122a, the method to form the semiconductor device may include forming a gate oxide material layer 121a over the substrate 100. Thus, the gate material layer 122a may cover the gate oxide material layer 121a.

The gate oxide material layer 121a may be used to form the gate oxide layer. Specifically, the gate oxide material layer 121a may be formed on the substrate through thermal oxidation. Thus, the material of the gate oxide material layer 121a may be silicon oxide.

Figure 5:
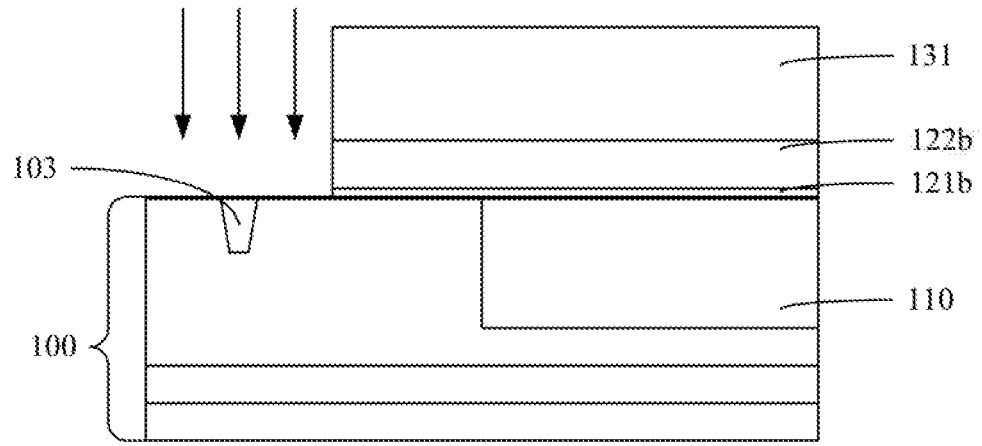

Referring to FIG. 9, after forming the gate material layer, a first etching process is performed on the gate material layer to remove a portion of the gate material layer, to expose a portion of the substrate (S903). FIG. 5 illustrates a corresponding structure.

As shown in FIG. 5, a first etching process may be performed on the gate material layer 122a (as shown in FIG. 4), to remove a portion of the gate material layer 122a, to expose a portion of the substrate 100.

Specifically, the first etching process may be used to remove a portion of the gate material layer 122a. Correspondingly, the first etching process may stop until the surface of the substrate 100 is exposed.

In one embodiment, the insulation structure 103 and the drift region 110 may be formed in the substrate 100. The process to perform the first etching may include removing the portions of the gate material layer 122a over the top of the insulation structure 103 and over the portion of the substrate 100 neighboring the insulation structure 103, to expose the top of the insulation structure 103 and the portion of the substrate 100 neighboring the insulation structure 103. The remaining portion of the gate material layer 122a may be located over the drift region 110, and over the portion of the substrate neighboring the drift region 110.

The step to perform the first etching process may include forming a first mask 131 over the gate material layer 122a. The first mask layer 131 may include a first opening exposing the surface of the gate material layer 122a. The first mask 131 may be used as a mask to perform the first etching process, to expose a portion of the substrate 100.

The first mask 131 may define the location and the dimensions of the portion of the gate material layer 122a being etched away by the first etching process. The first mask 131 may also protect the remaining portion of the gate material layer 122a during the fabrication.

Specifically, the first mask 131 may be a patterned photoresist layer. Thus, the first mask 131 may be formed by spin-coating process and a photolithography process. In some embodiments in the present disclosure, the first mask 131 may be a mask formed by a multiple patterning process. The multiple patterning process may include one or more of a self-aligned double patterning (SaDP) process, a self-aligned triple patterning process, and a self-aligned double double patterning (SaDDP) process.

In one embodiment, the first etching process may remove the portion of the gate material layer 122a over the top of the insulation structure 103 and the portion of the substrate 100 neighboring the insulation structure 103. Thus, the first opening may be located over the insulation structure 103 and the portion of the substrate 100 neighboring the insulation structure 103.

After forming the first mask 131, the first mask 131 may be used as a mask to perform the first etching process to remove the portion of the gate material layer 122a exposed or not covered by the first mask 131. The first etching process may stop until the substrate 100 is exposed. Specifically, the first etching process may be a dry etching process.

In one embodiment, a gate oxide material layer 121a may be formed between the gate material layer 122a and the substrate 100. Thus, the first etching process may include performing the first etching process on the gate oxide material layer 121a, to remove a portion of the gate oxide material layer 121a, and expose the surface of the substrate 100.

After the first etching process, the remaining portion of the gate material layer 122b and the remaining portion of the gate oxide material layer 121b may be located over the drift region 110 and portion of the substrate 100 neighboring the drift region 110.

Figure 6:
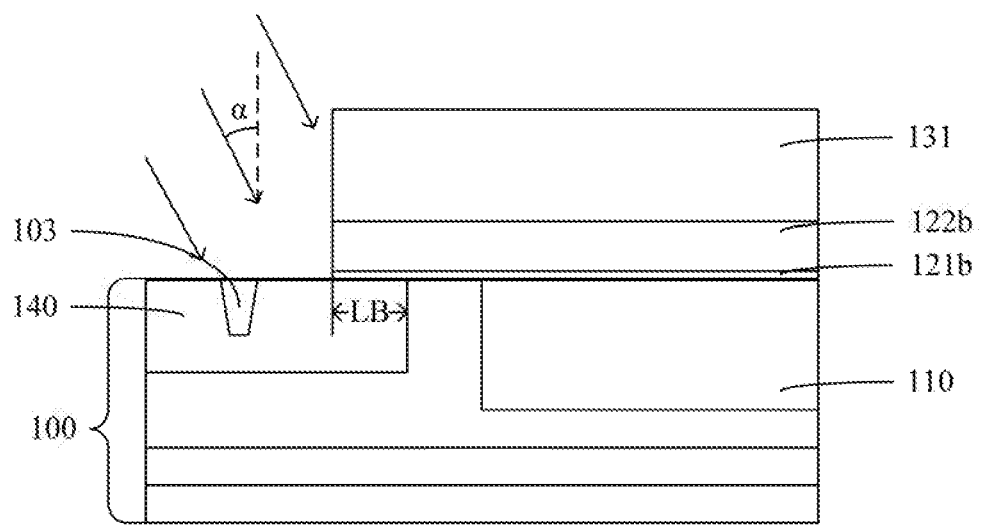

Referring to FIG. 9, after performing the first etching process, a first ion implantation process is performed on the portion of the substrate exposed by the first mask to form a body region in the substrate, the body region extending to under the remaining portion of the gate material layer (S904). FIG. 6 illustrates a corresponding structure.

As shown in FIG. 6, a first ion implantation process may be performed on the portion of the substrate 100 exposed by the first mask 131 to form a body region 140 in the substrate 100. The body region 140 may be doped with first dopant ions. The body region 140 extending to be under the remaining portion of the gate material layer 122b.

The body region 140 may separate the source region from the channel region of the LDMOS transistor, and extend the current channel of the LDMOS transistor, improving the voltage durability of the LDMOS transistor. Specifically, the first mask 131 may be used as a mask to perform the first ion implantation process. The portion of the substrate 100 exposed by the first mask 131 may be doped with first dopant ions to form the body region 140.

Specifically, the first ion implantation may include performing a lateral ion implantation as the first ion implantation process. During the lateral ion implantation process, the inclination angle ca of the first ion implantation may be between about 30 degrees to about 45 degrees. The inclination angle α may be the angle between the direction of the ion implantation and the normal of the surface of the substrate 100.

During the first ion implantation process, the first mask 131 may be used to protect the remaining portions of the gate material layer 122b and the gate oxide material layer 121b. Because the first mask 131 is the mask used in the first etching process, the first ion implantation may be performed on the portion of the substrate 100 exposed by the first mask 131 through a lateral ion implantation into the substrate 100. The dopant ions may diffuse in the substrate 100 such that the body region 140 extends under the remaining portion of the gate material layer 122b. Accordingly, the control ability of the gate, over the body region 140, may be ensured. The overlapping area/distance between the gate electrode, subsequently formed, and the body region 140, may be further decreased. Accordingly, the breakdown voltage of the transistor may be further increased. Specifically, in one embodiment, the dimension LB of the overlapping area between the body region 140 and the remaining portion of the gate material layer 122b may be less than about 0.1 μm.

In addition, in one embodiment, the substrate 100 may include an insulation structure 103 and a drift region 110. During the first etching process, the top of the insulation structure 103 and the portion of the substrate 100 neighboring the insulation structure 103 may be exposed. Thus, during the first ion implantation process, the body region 140 may be formed in the substrate 100 neighboring the insulation structure 103. The body region 140 and the drift region 110 be separated by a second spacing, between adjacent sidewalls of the body region 140 and the drift region 110. The second spacing may be smaller than the first spacing between the insulation structure 103 and the drift region 110.

In one embodiment, the LDMOS transistor may be N-type transistor. The first dopant ions may be P-type ions, which may include one or more of boron ions, indium ions, and gallium ions. In one embodiment, the first dopant ions may be boron ions.

Because the atomic weight of boron ions is smaller, boron ions may easily diffuse into the substrate 100. By performing the first ion implantation process after the formation of the gate oxide material layer 121a (as shown in FIG. 4), diffusion of the first dopant ions in the body region 140 during the thermal oxidation process for forming the gate oxide material layer 121a, may be avoided. The diffusion of the first dopant ions in the substrate 100 may be alleviated/reduced effectively. Accordingly, the dimension of the overlapping area between the body region 140 and the remaining portion of the gate material layer 122b may be reduced. The channel region of the formed LDMOS transistor may be expanded, and the breakdown voltage of the LDMOS transistor may be increased.

Referring to FIG. 9, after performing the first ion implantation process to form a body region in the substrate, a second etching process is performed on the remaining portion of the gate material layer to remove a portion of the remaining portion of the gate material layer on a side away from the body region, to form a gate electrode (S905). FIG. 7 illustrates a corresponding structure.

Referring to FIG. 7, a second etching process is performed on the remaining portion of the gate material layer 122b to remove a portion of the remaining portion of the gate material layer 122b away from the body region 140, to form a gate electrode 122.

Specifically, in one embodiment, a gate oxide material layer may be formed over the surface of the substrate 100. Accordingly, the second etching process may also include performing the second etching on the remaining portion of the gate oxide material layer 121b to form a gate oxide layer 121. The gate oxide layer 121 and the gate electrode 122 may form a gate structure 120.

After performing the first ion implantation process and before performing the second etching process, the method to form the semiconductor device may further include removing the first mask 131 to expose the surface of the remaining portion of the gate material layer 122b.

In one embodiment, a body region 140 and a drift region 110 may be formed in the substrate 100. A second spacing may be between the body region 140 and the drift region 110. Accordingly, the process of the second etching process may include removing a top portion of the drift region 110 and a portion of the gate material layer 122b away from the body region 140, to form the gate structure. The gate structure may be located over a portion of the body region 140, a portion of the drift region 110, and the portion of the substrate 100 between the body region 140 and the drift region 110.

The second etching process may also include forming a second mask 132 covering the body region 140 and the remaining portion of the gate material layer 122b. The second mask 132 may include a second opening exposing the remaining portion of the gate material layer 122b. The second mask 132 may be used as a mask to perform the second etching process, to remove the portions of the gate material layer over the top of the drift region 110 and on the side away from the body region 140, to form the gate electrode 122.

The second mask 132 may define the dimensions of the gate electrode 122, and may protect the body region 140 and the gate electrode 122 from being affected by the second etching process during the second etching process. Specifically, the second mask 132 may be a patterned photoresist layer. The second mask 132 may be formed by a spin coating process and a photolithography process. In addition, the second mask 132 may be formed through a multiple patterning process.

In one embodiment, the second etching process may be used to remove the portions of the gate material layer over the top of the drift region 110 and one the side away from the body region 140. Thus, the second opening may be located over the drift region 110 and one the side away from the body region 140.

After forming the second mask 132, the second mask 132 may be used as a mask to perform the second etching to remove a portion of the gate material layer 122a. The second etching may stop until the substrate 100 is exposed. Specifically, the second etching process may include a dry etching process.

Referring to FIG. 9, after performing the second etching process on the remaining portion of the gate material layer to form a gate electrode, a source region, a drain region, a doped region, and connection plugs are formed (S906). FIG. 8 illustrates a corresponding structure.

Referring to FIG. 8, after forming the gate structure 120, a source region 141 may be formed in the body region 140 on one side of the gate structure 120. The source region 141 may be doped with second dopant ions. A drain region 11l may be formed in the drift region 110 on the other side of the gate structure 122. The drain region 111 may be doped with second dopant ions. In addition, a doped region 142 may be formed in the body region 140 on the side of the insulation structure 103 away from the drift region 110. Connection plugs 151 may be formed on the surfaces of the doping region 142, the source region 141 and the drain region 111.

According to simulation results, the drain current $I_{dlin}$ of an LDMOS transistor, formed by the present disclosure, may be increased up to about 33.6 μA/μm, and the breakdown voltage may be about 17.3V. The drain current of an LDMOS transistor, not formed by the present disclosure, may only be about 32.2 μA/μm, and the breakdown voltage may be about 17.2V. Thus, by using the present technical solution, the breakdown voltage of an LDMOS transistor may be maintained and the drain current may be effectively increased. Thus, based on the conversion between the drain current and the on-resistance, the on-resistance may be decreased from about 5.1 mohm·mm$^2$ to about 4.6 mohm·mm$^2$. That is, by using the present disclosure, the on-resistance of an LDMOS may reduce by around 10%. Thus, the present disclosure may be able to reduce the on-resistance without reducing the breakdown voltage of an LDMOS transistor.

In addition, according to the simulation results, the maximum substrate current of LDMOS transistor formed by the present disclosure may reduce to about 23.4 µA/µm, and the maximum substrate current of an LDMOS transistor not formed by the present disclosure may be about 26.2 µA/µm. Thus, the present disclosure may reduce the maximum substrate current and improve device reliability.

In the present disclosure, a first etching process may be used to remove a portion of the gate material layer to expose a portion of the substrate. Further, a first ion implantation process may be performed on the exposed portion of the substrate to form a body region. Further, a second etching process may be performed to remove another portion of the gate material layer to form the gate electrode. According to the present disclosure, two etching processes may be used to form the gate electrode, the first ion implantation process may be performed between the two etching processes to form the body region. The first ion implantation process may be performed directly on the exposed portion of the substrate. The diffusion of dopant ions may facilitate the body region to extend to be under the gate electrode. Accordingly, the gate electrode may cover and control the body region, and the dimension of the overlapping area between the body region and the gate electrode can be further decreased. The breakdown voltage of the formed transistor can be further increased and the on-resistance of the formed transistor can be further decreased. In addition, in one embodiment of the present disclosure, after providing the substrate and before forming the gate material layer, the method to form the semiconductor device may include forming a gate oxide material layer over the substrate. Because the gate oxide material layer is often formed through thermal oxidation, performing the first ion implantation, for forming the body region, after the formation of the gate oxide material layer, diffusion of the first dopant ions in the body region during the formation of the gate oxide material layer may be effectively prevented. The dimension of the overlapping region between the body region and the gate electrode may be effectively reduced, and the breakdown voltage of the transistor may be increased.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for forming a semiconductor device, comprising:
   providing a substrate;
   forming an insulation structure in a top portion of the substrate;
   forming a gate material layer over the substrate and the insulation structure;
   performing a first etching process on the gate material layer to remove a first portion of the gate material layer and expose a first portion of the substrate and a top surface of the insulation structure;
   performing a first ion implantation process directly on the exposed first portion of the substrate to form a body region in the substrate, the body region being doped with first dopant ions and extending to under a remaining portion of the gate material layer, wherein
      the body region surrounds the insulation structure from two sides and a bottom of the insulation structure and exposes the top surface of the insulation structure, and
      a dimension of an overlapping area of the body region to the remaining portion of the gate material layer in a direction parallel to a top surface of the substrate in a cross-section view is less than 0.1 µm;
   forming a gate electrode by performing a second etching process on the remaining portion of the gate material layer to remove a second portion of the gate material layer, the second portion of the gate material layer being located on a side away from the body region;
   forming a source region in a surface portion of the body region on one side of the gate structure between the insulation structure and the gate electrode, wherein the source region extends under the gate electrode; and
   forming a doped region in a surface portion of the body region on the side of the insulation structure away from the gate electrode, wherein the doped region are isolated from the source region by the insulation structure.

2. The method according to claim 1, wherein the first etching process includes:
   forming a first mask layer over the gate material layer, the first mask layer having a first opening exposing the gate material layer; and
   using the first mask layer as a mask to perform the first etching process and expose the first portion of the substrate.

3. The method according to claim 2, further including: after the first ion implantation process and before the second etching process, removing the first mask layer.

4. The method according to claim 3, wherein the first mask layer includes a photoresist layer.

5. The method according to claim 3, wherein the first mask layer is used as a mask for performing the first ion implantation process.

6. The method according to claim 1, wherein the semiconductor device is an N type transistor and the first dopant ions are P type ions.

7. The method according to claim 6, wherein the P type ions includes one or more of boron ions, indium ions, and gallium ions.

8. The method according to claim 1, wherein an inclination angle of the first ion implantation process is about 30 degrees to about 45 degrees, the inclination angle being an angle between a direction of the lateral ion implantation process and a normal of a surface of the substrate.

9. The method according to claim 1, wherein the second etching process includes:
   forming a second mask layer covering the body region and the remaining portion of the gate material layer, the second mask layer including a second opening exposing the second portion of the gate material layer; and using the second mask layer as a mask to perform the second etching process to remove the second portion of the gate material layer, to form the gate electrode.

10. The method according to claim 9, wherein the second mask layer includes a photoresist layer.

11. The method according to claim 1, wherein one or more of the first etching process and the second etching process include a dry etching process.

12. The method according to claim 1, further comprising forming a gate oxide material layer before forming the gate material layer, wherein the gate material layer is formed over the gate oxide material layer.

13. The method according to claim 12, wherein:
the first etching process etches the first gate oxide material layer to remove a first portion of the gate oxide material layer and form a remaining portion of the gate oxide material layer, and expose the first portion of the substrate; and
the second etching process etches the remaining portion of the gate oxide material layer to remove a second portion of the gate oxide material layer at a side away from the body region, to form a gate oxide layer, the gate oxide layer and the gate electrode forming a gate structure.

14. The method according to claim 13, wherein the gate oxide material layer is formed through a thermal oxidation process.

15. A method for forming a lateral diffusion MOS (LDMOS) transistor, comprising:
providing a substrate having a drift region and an insulation structure, spaced apart in the substrate by a first spacing;
forming a gate material layer over the substrate;
performing a first etching process on the gate material layer to remove a first portion of the gate material layer and expose a first portion of the substrate;
performing a first ion implantation process on the first portion of the substrate to form a body region in the substrate, the body region being doped with first dopant ions and extending to under a remaining portion of the gate material layer, wherein the body region surrounds the insulation structure from two sides and a bottom of the insulation structure and exposes the top surface of the insulation structure, and
a dimension of an overlapping area of the body region to the remaining portion of the gate material layer in a direction parallel to a top surface of the substrate in a cross-section view is less than 0.1 μm;
performing a second etching process on the remaining portion of the gate material layer to remove a second portion of the gate material layer to form a gate electrode, the second portion of the gate material layer being located on a side away from the body region, the gate electrode covering a portion of the body region, a portion of the drift region, and a portion of the substrate between the drift region and the body region; and
forming a source region in a surface portion of the body region on one side of the gate structure between the insulation structure and the gate electrode, wherein the source region extends under the gate electrode; and
forming a doped region in a surface portion of the body region on the side of the insulation structure away from the gate electrode, wherein the doped region are isolated from the source region by the insulation structure.

16. The method according to claim 15, further forming a drain region in the drift region, the drift region, the source region, and the drain region each being doped with second dopant ions, wherein a second spacing between the drift region and the body region is smaller than the first spacing.

17. The method according to claim 16, wherein the LDMOS transistor is an N type transistor and the second dopant ions are N type ions.

18. The method according to claim 17, wherein the N type ions include one or more of phosphoric ions, arsenic ions, and antimony ions.

19. The method according to claim 1, wherein performing the first ion implantation process directly on the exposed first portion of the substrate is after performing the first etching process and before performing the second etching process.

20. The method according to claim 1, further comprising:
forming a connection plug on the surface of the doped region and the source region, respectively.

* * * * *